US010630172B2

(12) United States Patent
Babazadeh et al.

(10) Patent No.: US 10,630,172 B2
(45) Date of Patent: Apr. 21, 2020

(54) SWITCHED-CAPACITOR CONVERTERS WITH CAPACITOR PRE-CHARGING

(71) Applicant: Infineon Technologies Austria AG, Villach (AT)

(72) Inventors: Amir Babazadeh, Laguna Hills, CA (US); Jens Ejury, Fremont, CA (US); Benjamim Tang, Rancho Palos Verdes, CA (US); Robert Carroll, Andover, MA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/654,237

(22) Filed: Jul. 19, 2017

(65) Prior Publication Data

US 2019/0028025 A1 Jan. 24, 2019

(51) Int. Cl.

*H02M 3/07* (2006.01)
*H02M 1/36* (2007.01)

(Continued)

(52) U.S. Cl.

CPC .......... *H02M 3/07* (2013.01); *H01L 23/5223* (2013.01); *H01L 27/088* (2013.01); *H02M 1/36* (2013.01);

(Continued)

(58) Field of Classification Search

CPC ... H02M 3/07; H02M 3/1588; H01L 23/5223; H01L 27/088; H03H 19/004; H05B 33/0815

See application file for complete search history.

(56) References Cited

U.S. PATENT DOCUMENTS 4,178,612 A * 12/1979 Dudley .................... H04N 5/33 348/607
4,316,101 A * 2/1982 Minner ................ H03K 17/687 327/434

(Continued)

OTHER PUBLICATIONS

Du, Sixing et al., "A Startup Method for Flying-Capacitor Modular Multilevel Converter (FC-MMC) With Effective Damping of LC Oscillations", IEEE Transactions on Power Electronics, vol. 32, No. 7, Jul. 2017, pp. 5827-5834.

(Continued)

*Primary Examiner* — Nguyen Tran
*Assistant Examiner* — Demetries A Gibson
(74) *Attorney, Agent, or Firm* — Murphy, Bilak & Homiller, PLLC

(57) ABSTRACT

A switched-capacitor converter includes a rectifier at the output, a plurality of legs coupled between the input and the rectifier, and a controller. Each leg of the switched-capacitor converter includes a capacitor, and a switch device is connected to each leg. A first group of the legs is coupled to a first branch of the rectifier, and a second group of the legs is coupled to a second branch of the rectifier. The controller alternates switching of the first and second groups of legs after startup, to transfer energy from the input to the output during a first part of each switching cycle via the first group of legs and to ground during a second part of each switching cycle via the second group of legs. The controller or a current limited source provides for pre-charging of at least one of the capacitors during startup.

15 Claims, 11 Drawing Sheets

(51) Int. Cl.

| | |
|---|---|
| ***H01L 23/522*** | (2006.01) |
| ***H01L 27/088*** | (2006.01) |
| ***H02M 3/158*** | (2006.01) |
| ***H03H 19/00*** | (2006.01) |
| ***H05B 33/08*** | (2020.01) |

(52) U.S. Cl.

CPC ......... *H02M 3/073* (2013.01); *H02M 3/1588* (2013.01); *H03H 19/004* (2013.01); *H05B 33/0815* (2013.01)

(56) References Cited

U.S. PATENT DOCUMENTS

| | | | | |
|---|---|---|---|---|
| 5,101,334 | A * | 3/1992 | Plagge | H02J 7/022 363/19 |
| 5,581,454 | A | 12/1996 | Collins | |
| 7,821,305 | B1 * | 10/2010 | Limotyrakis | H03K 19/018521 326/81 |
| 8,503,203 | B1 | 8/2013 | Szczeszynski et al. | |
| 8,817,501 | B1 * | 8/2014 | Low | H02M 3/07 363/59 |
| 9,054,576 | B2 | 6/2015 | Kang et al. | |
| 9,831,776 | B1 | 11/2017 | Jiang et al. | |
| 9,917,517 | B1 | 3/2018 | Jiang et al. | |
| 9,992,827 | B2 | 6/2018 | Moussakov et al. | |
| 10,103,621 | B2 | 10/2018 | Junmin et al. | |
| 2007/0200538 | A1 | 8/2007 | Tang et al. | |
| 2010/0097045 | A1 | 4/2010 | Chen | |
| 2010/0117719 | A1 | 5/2010 | Matano | |
| 2012/0223583 | A1 | 9/2012 | Cooley et al. | |
| 2014/0002038 | A1 | 1/2014 | Hsu et al. | |
| 2014/0285167 | A1 | 9/2014 | Audy et al. | |
| 2015/0016163 | A1 | 1/2015 | Krainer et al. | |
| 2015/0097546 | A1 | 4/2015 | Pan et al. | |
| 2015/0102793 | A1 | 4/2015 | Wang et al. | |
| 2015/0365013 | A1 | 12/2015 | Hameed et al. | |
| 2016/0028304 | A1 | 1/2016 | O'Day | |
| 2016/0141951 | A1 * | 5/2016 | Mao | H02M 1/36 363/21.02 |
| 2016/0262226 | A1 * | 9/2016 | Kangyo | H05B 33/0815 |
| 2017/0106820 | A1 * | 4/2017 | Maruyama | B60R 16/033 |

OTHER PUBLICATIONS

Sepahvand, Hossein et al., "Start-up Procedure and Switching Loss Reduction for a Single-Phase Flying Capacitor Active Rectifier", IEEE Transactions on Industrial Electronics, vol. 60, No. 9, Sep. 2013, pp. 3699-3710.

Li, Yanchao et al., "Multilevel Modular Switched-Capacitor Resonant Converter with Voltage Regulation", IEEE Applied Power Electronics Conference and Exposition (APEC), Mar. 2017, pp. 88-93.

Cao, Dong, et al., "Multilevel Modular Converter with Reduced Device Count for Hybrid and Electric Vehicle", 2015 IEEE Transportation Electrification Conference and Expo (ITEC), Jun. 2015.

Cao, Dong, et al., "Optimal Design of Multilevel Modular Switched-Capacitor DC-DC Converter", 2011 IEEE Energy Conversion Congress and Exposition, Sep. 2011, pp. 537-544.

Cao, Dong, et al., "Zero Voltage Switching Double-Wing Multilevel Modular Switched-Capacitor DC-DC Converter with Voltage Regulation", 2013 Twenty-Eighth Annual IEEE Applied Power Electronics Conference and Exposition (APEC), Mar. 2013, pp. 2029-2036.

Cao, Dong, et al., "Zero-Current-Switching Multilevel Modular Switched-Capacitor DC-DC Converter", IEEE Transactions on Industry Applications, vol. 46, No. 6, Nov./Dec. 2010, pp. 2536-2544.

Curuvija, Boris, et al., "Single-Wing Ladder Resonant Multilevel Converter", 2016 IEEE 4th Workshop on Wide Bandgap Power Devices and Applications (WiPDA), Nov. 2016, pp. 328-333.

* cited by examiner

SWITCHED-CAPACITOR CONVERTERS WITH CAPACITOR PRE-CHARGING

TECHNICAL FIELD

The present application relates to switched-capacitor converters, in particular startup control for switched-capacitor converters.

BACKGROUND

Switched-capacitor converters are a class of voltage converters which provide energy transfer and voltage conversion using capacitors. Each leg of a switched-capacitor converter includes a capacitor, and a switch device is connected to each leg for controlling charging of the capacitors. In some implementations, some of the legs also include inductors which makes those legs resonant. In either case, different groups of the converter legs are coupled to different branches of a rectifier at the output. The different groups of converter legs are switched alternately to transfer energy from the input to the output. The rectifier, such as a half-bridge rectifier, rectifies the energy transferred from the capacitors during each switching cycle. The rectified output can be applied directly to a load, or to another converter stage such as a buck converter, a POL (point-of-load) converter, etc.

Initial capacitor voltages and inductor currents at startup may be either zero or different from the steady-state values, causing large spikes and inrush current which place very high stress on the switch devices, especially the switch device closest to the input, and other components. To optimize the size of the capacitors, inductors and switch devices of a switched-capacitor converter, the inrush current should be reduced or ideally prevented. Conventionally, a shunt resistor is placed in series with the switched-capacitor converter input. An external switch is connected in parallel with the shunt resistor to bypass the shunt resistor during post startup operation. The inrush current is reduced, but the approach Is not suitable for pre-charging the capacitors during startup. Hence, a relatively high shunt value is required which makes the startup process very slow. An improved technique is needed for pre-charging one or more capacitors of a switched-capacitor converter,

SUMMARY

According to an embodiment of a switched-capacitor converter, the converter comprises: an input; an output; a rectifier at the output; a plurality of legs coupled between the input and the rectifier, each leg comprising a capacitor, a first group of the legs being coupled to a first branch of the rectifier and a second group of the legs being coupled to a second branch of the rectifier; a switch device connected to each leg; and a controller. The controller is operable to alternate switching of the first and the second groups of legs after startup, to transfer energy from the input to the output during a first part of each switching cycle via the first group of legs and to ground during a second part of each switching cycle via the second group of legs. The controller is further operable control the switch devices during startup so that a combination of the switch devices which are normally switched in a complimentary manner after startup are on at the same time to pre-charge at least one of the capacitors.

According to another embodiment of a switched-capacitor converter, the converter comprises: an input; an output; a rectifier at the output; a plurality of legs coupled between the input and the rectifier, each leg comprising a capacitor, a first group of the legs being coupled to a first branch of the rectifier and a second group of the legs being coupled to a second branch of the rectifier; a switch device connected to each leg; a controller; and a current limited source coupled between the input and the plurality of legs. The controller is operable to alternate switching of the first and the second groups of legs after startup, to transfer energy from the input to the output during a first part of each switching cycle via the first group of legs and to ground during a second part of each switching cycle via the second group of legs. The current limited source is operable to pre-charge at least one of the capacitors during startup.

According to yet another embodiment of a switched-capacitor converter, the converter comprises: an input; an output; a rectifier at the output; a plurality of legs coupled between the input and the rectifier, each leg comprising a capacitor, a first group of the legs being coupled to a first branch of the rectifier and a second group of the legs being coupled to a second branch of the rectifier; a switch device connected to each leg; and a controller. The controller is operable to alternate switching of the first and the second groups of legs after startup, to transfer energy from the input to the output during a first part of each switching cycle via the first group of legs and to ground during a second part of each switching cycle via the second group of legs. The controller is further operable adjust a gate-to-source voltage applied to at least one of the switch devices during startup, to adjust an on-state resistance of the at least one switch device.

According to still another embodiment of a switched-capacitor converter, the converter comprises: an input; an output; a rectifier at the output; a plurality of legs coupled between the input and the rectifier, each leg comprising a capacitor, a first group of the legs being coupled to a first branch of the rectifier and a second group of the legs being coupled to a second branch of the rectifier; a switch device connected to each leg; and a controller. The controller is operable to alternate switching of the first and the second groups of legs after startup, to transfer energy from the input to the output during a first part of each switching cycle via the first group of legs and to ground during a second part of each switching cycle via the second group of legs. The controller is further operable to turn each switch device on and off in succession in a burst mode during startup, starting with the switch device closest to the input and ending with the switch device furthest from the input.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide for pre-charging of one or more capacitors of a switched-capacitor converter during startup, such that the transition from startup to regular (post startup) operation occurs with lower stress on the switch devices and other components of the switched-capacitor converter in the shortest possible time.

Figure 1:
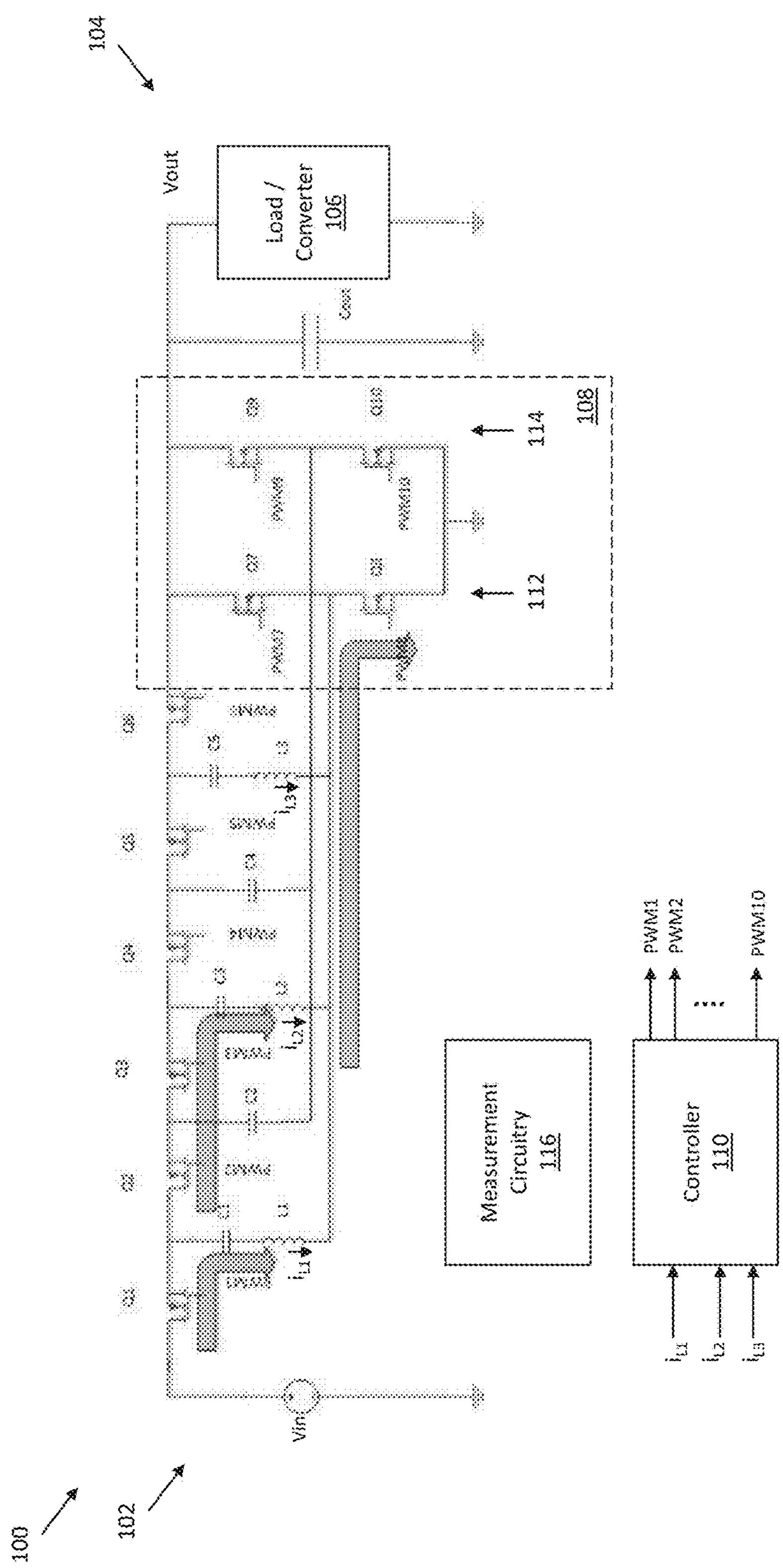
FIG. 1 illustrates a block diagram of an embodiment of a switched-capacitor converter with capacitor pre-charging.

FIG. 1 illustrates an embodiment of a switched-capacitor converter 100 with capacitor pre-charging during startup. The switched-capacitor converter 100 has an input 102 coupled to a voltage source Vin, an output 104 coupled to a load or other converter 106, a rectifier 108 and output capacitor Cout at the output 104, and a plurality of legs coupled between the input 102 and the rectifier 108. The rectified output voltage Vout can be applied directly to a load or another converter stage 106 such as a buck converter, a POL (point-of-load) converter, etc. For example, the input voltage Vin may range from 36 V to 54 V and the output voltage Vout may range from 6V to 9V in a multi-stage converter case. In each case, a controller 110 for the switched-capacitor converter 100 maintains proper switching of the converter legs to transfer energy from the input 102 to the output 104.

Each leg of the switched-capacitor converter 100 includes a respective capacitor Cy. Some of the legs, also referred to herein as resonant legs, include an inductor Lx connected to the corresponding capacitor Cy. A switch device Qx is connected to each leg, for controlling charging of the capacitors Qx. Six legs in total are shown in FIG. 1, where resonant leg 1 includes resonant capacitor C1 and inductor L1, leg 2 includes flying capacitor C2, resonant leg 3 includes resonant capacitor C3 and inductor L2, leg 4 includes flying capacitor C4, resonant leg 5 includes resonant capacitor C5 and inductor L3, and leg 6 includes flying capacitor C6. The switch devices Qx can be discrete power transistor dies (chips), integrated power stages which include at least the power transistors that form the individual switch device and the corresponding driver and control circuitry, etc.

The (first) group of resonant legs which includes resonant capacitors C1, C3 and C5 is coupled to a first branch 112 of the rectifier 108, and the (second) group of non-resonant legs which includes flying capacitors C2, C4 and C6 is coupled to a second branch 114 of the rectifier 108. The rectifier is a switched capacitor rectifier in that for each group of legs, the AC currents are in opposite phase during normal (post startup) operation. While the first group is charging during normal operation, the other group is discharging. The rectifier switches alternatively connect each leg to the output when the current is being discharged, and to ground when the current is charging. In one embodiment, each branch 112, 114 of the rectifier 108 includes two switch devices Qm/Qn coupled as a half bridge. Other rectifier configurations are possible.

With the exemplary 6:1 topology shown in FIG. 1 and with n=3, the steady state voltages across the capacitors of the respective legs during normal operation are as follows:

$$V_{C5}=1*V\text{out}$$

$$V_{C4}=2*V\text{out}$$

$$V_{C3}=3*V\text{out}$$

$$V_{C2}=4*V\text{out}$$

$$V_{C1}=5*V\text{out}$$

The conversion ratio for the exemplary system shown in FIG. 1 is Vout/Vin=2n=6. In general, the switched-capacitor converter 100 can include any even number of legs. For example, the switched-capacitor converter 100 can include two legs and Vout/Vin=2n=2, or the switched-capacitor converter 100 can include four legs and Vout/Vin=2n=4, or the switched-capacitor converter 100 can include eight legs and Vout/Vin=2n=6, etc. The number of legs depends on the application in which the converter 100 is to be used.

The controller 110 of the switched-capacitor converter 100 alternates switching of the first (resonant) and the second (non-resonant) groups of legs to transfer energy from the input 102 to the output 104 during post startup operation. For example, switch devices Q1, Q3, Q5, Q7 and Q10 can be switched via a first PWM (pulse width modulation) signal with approximately 50% duty cycle and switch devices Q2, Q4, Q6, Q8 and Q9 can be switched via the complementary PWM signal with dead time between the PWM signals. The controller 110 can implement other duty cycle combinations post startup.

During startup, the capacitor voltages $V_{C1}$, $V_{C2}$, etc. and the inductor currents $i_{L1}$, $i_{L2}$, etc, of the switched-capacitor converter 100 are either zero or different from the respective steady-state values. The controller 110 ensures one or more of the capacitors C1 through C6 is pre-charged during startup, by controlling the switch devices so that a combination of the switch devices which are normally switched in a complimentary manner after startup are on at the same time to pre-charge at least one of the capacitors during startup. The on-time of the switch devices during startup can be limited (reduced) to just enough time to charge the corresponding capacitors, thus limiting the inrush current during startup.

In the exemplary switched-capacitor converter topology illustrated in FIG. 1, switch devices Q1, Q3, Q5, Q7 and Q10 are on for a first part of each switching cycle during post startup operation and switch devices Q2, Q4, Q6, Q8 and Q9 are on for a second part of each switching cycle. During startup, the controller 110 can pre-charge at least resonant capacitor C1 by adapting the PWM control so that switch devices Q1 and Q8 are on at the same time during startup. FIG. 1 shows exemplary current paths through resonant capacitors C1 and C3 during startup as thick arrows, which can be realized by appropriate control of the corresponding PWM signals. In general, the controller 110 can modify the PWM control of the switch devices to limit voltage overshoot on the capacitors, e.g. based on threshold values or time criteria as described in more detail below.

In one embodiment, the switched-capacitor converter 100 also includes measurement circuitry 116 such as DGR sense circuitry, on-state resistance ($R_{DSon}$) measurement circuitry, comparator circuitry, etc. for sensing or estimating the voltage across each of the capacitors during startup. The controller 110 turns off each switch device during startup when the voltage sensed across the capacitor connected to that switch device reaches a predetermined level for that capacitor, so that the switch devices connected to the capacitors with lower predetermined levels are turned off during startup before the switch devices connected to the capacitors with higher predetermined levels. In the exemplary switched-capacitor converter topology illustrated in FIG. 1, the controller 110 turns on switch devices Q1 through Q5, Q8 and Q10 to pre-charge capacitors C1 through C5, and then turns off switch devices Q5 through Q1 once capacitors C5 through C1 reach their desired respective levels. The measurement circuitry 116 can sense the voltage across resonant capacitor C1 or the switch node voltage between switch devices Q2 and Q3 for flying capacitor C2. The measurement circuitry 116 can sense the voltage across the other resonant capacitors in a similar manner.

In a second approach, the controller 110 turns on switch devices Q1 through Q3, Q8 and Q10 to pre-charge capacitors C1, C2 and C3 which are charged at a higher level than the other capacitors. In a third approach, the controller 110 implements the PWM control of switch device Q1 at a higher frequency than the other switch devices to charge resonant capacitor C1 via inductor L1 and switch device Q8, and subsequently charge flying capacitor C2 by switch device Q10 via switch device Q8 and inductor L1. The controller 110 can repeat the sequence for other downstream capacitor stages, and re-charge resonant capacitor C1 as needed.

Similar to the third approach, a fourth approach involves the controller 110 setting switch devices Q2 through Q5 in the on-state to charge all capacitors simultaneously. With the fourth approach, the controller 110 can turn on switch devices Q1 and Q8 for some time and charge resonant capacitor C1 and then use other switch devices to transfer energy from capacitor C1 to the other capacitors. Similar to the third approach, a fifth approach involves the controller 110 setting switch devices Q2 through Q5 in the on-state and switch device Q10 in the off state to charge resonant capacitors C1, C3 and C5 simultaneously. Subsequent turning off of switch device Q1 and turning on of switch devices Q2, Q4 and Q10 charges flying capacitors C2 and C4 resonantly via the inductors. The controller 110 can repeat the sequence until desired pre-charge capacitor voltage levels have been reached.

In another embodiment, the controller 110 turns off each switch device during startup when a timer value assigned to that switch device expires. The timer values correspond to respective pre-charge voltages of the capacitors connected to the switch devices.

Figure 2:
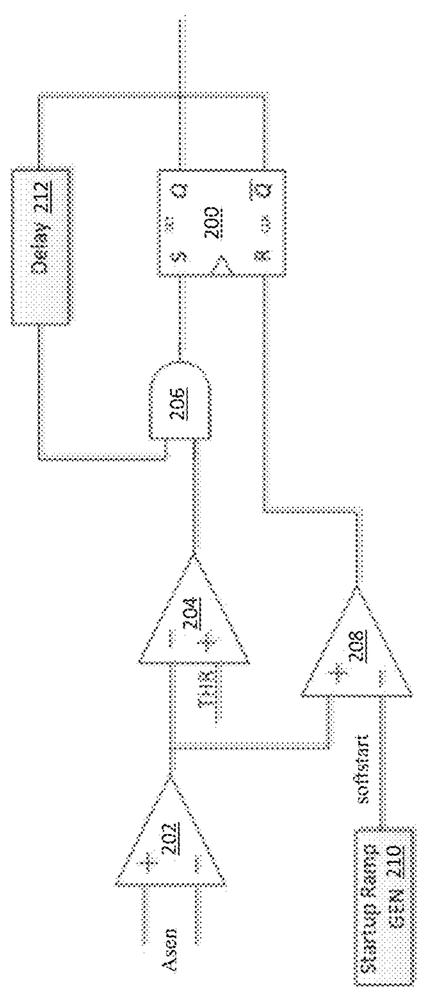
FIG. 2 illustrates a block diagram of an embodiment of timing circuitry for implementing capacitor pre-charging during startup.

FIG. 2 illustrates an embodiment of timing circuitry included in or associated with the controller 110 for implementing capacitor pre-charging during startup. According to this embodiment, the output Q of a flip-flop 200 controls a logical gate function between the PWM signal for switch device Q1 and the gate driver of switch device Q1. If the output Q of the flip-flop 200 is low, the gate of switch device Q1 is always low. If the output Q of the flip-flop 200 is high, the gate of switch device Q1 follows the corresponding PWM signal issued by the controller 110. Sensed current or capacitor voltage signal Asen, which can be generated e.g. by inductor current sensing of inductor L1, is input to a current sense comparator 202 and compared to a maximum reference value THR at the positive input of a second comparator 204. This is for resetting a logic gate 206 which re-enables the output Q of the flip-flop 200. The current sense comparator output also is input to a reset comparator 208 that compares the sensed current value to an ever increasing startup current value (softstart) at the negative input of the reset comparator 208. The startup current value can be generated by a ramp generator 210. When the current value output by the current sense comparator 202 is higher than the output of the ramp generator 210, the flip-flop 200 switches off and the gate of switch device Q1 goes low. After a delay 212, the flip-flop 200 can be reset when the current level falls below the reference level of the reset comparator 208.

Figure 3:
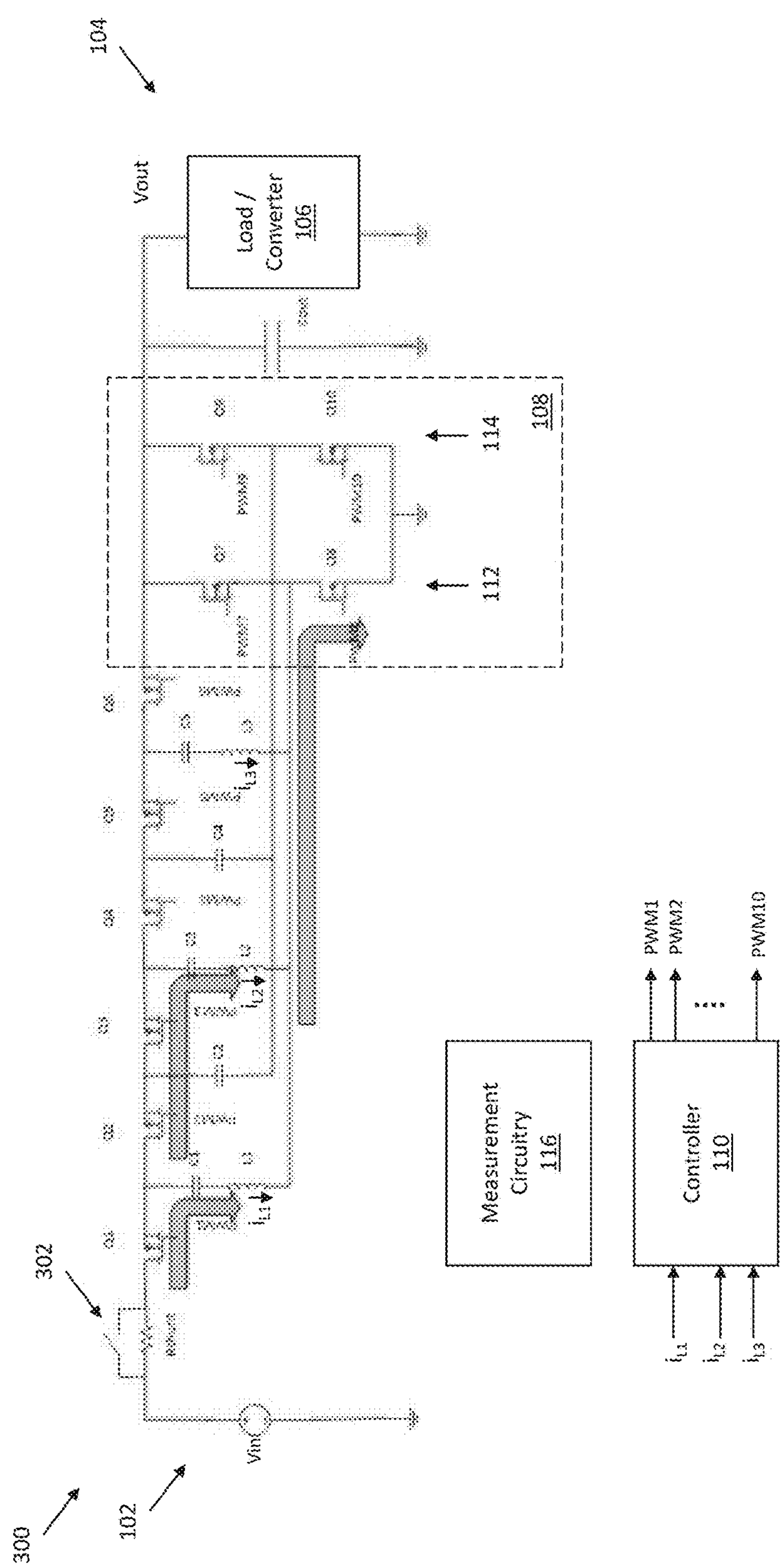
FIG. 3 illustrates a block diagram of another embodiment of a switched-capacitor converter with capacitor pre-charging.

FIG. 3 illustrates another embodiment of a switched-capacitor converter 300 with capacitor pre-charging during startup. The switched-capacitor converter embodiment shown in FIG. 3 is similar to the embodiment shown in FIG. 1. Different, however, the switched-capacitor converter 300 shown in FIG. 3 also includes a shunt resistor Rshunt between the input Vin and the legs of the switched-capacitor converter 300. The shunt resistor Rshunt controls the inrush current during startup. The shunt resistor Rshunt is bypassed by a switch device 302 after startup. The bypass switch device 302 can be turned on automatically, or by the controller 110. Any of the capacitor pre-charging embodiments described above in connection with FIGS. 1 and 2 can be implemented in the embodiment of FIG. 3, and are not repeated here.

Figure 4:
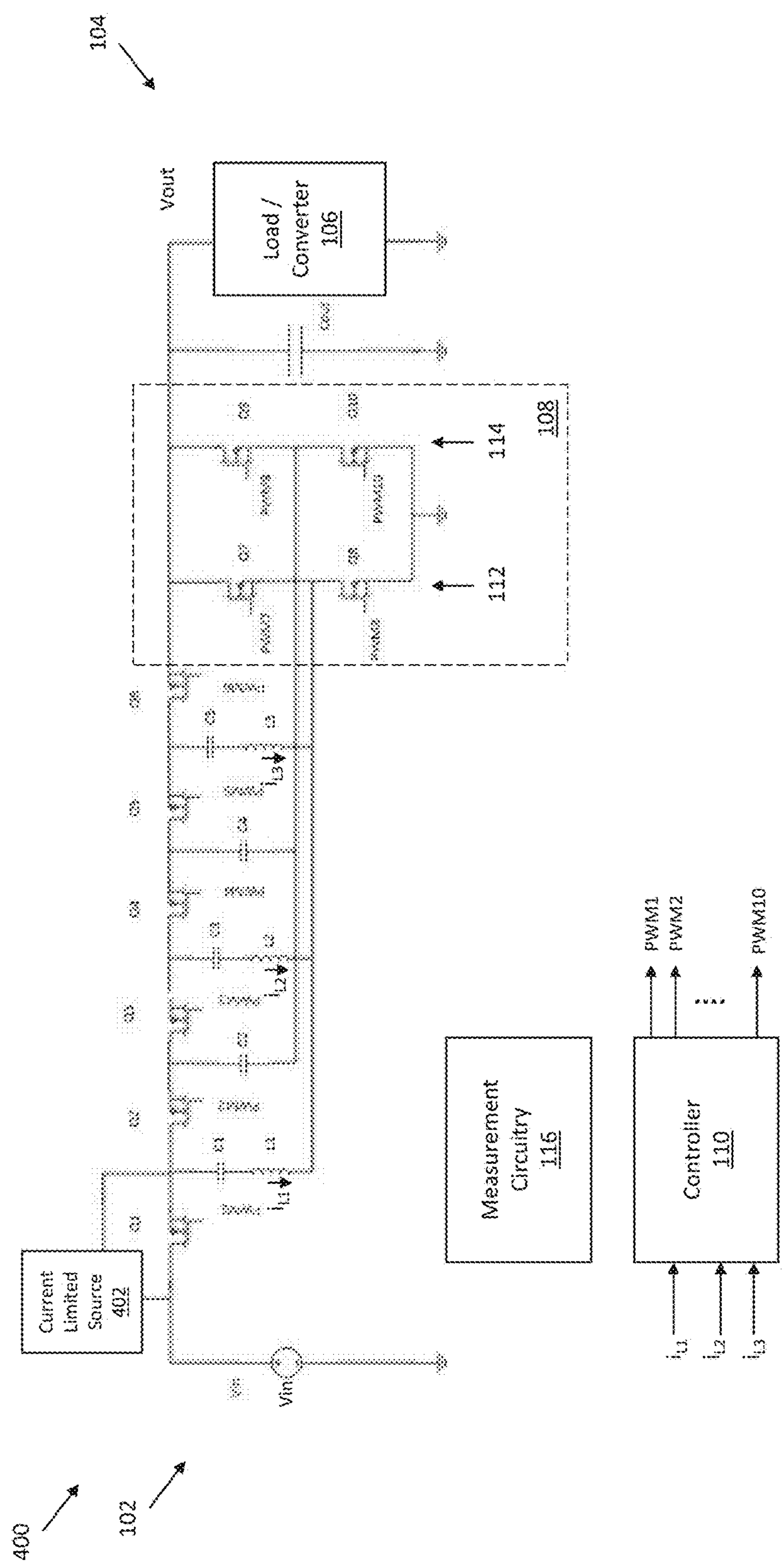
FIG. 4 illustrates a block diagram of yet another embodiment of a switched-capacitor converter with capacitor pre-charging.

FIG. 4 illustrates yet another embodiment of a switched-capacitor converter 400 with capacitor pre-charging during startup. The switched-capacitor converter embodiment shown in FIG. 4 is similar to the embodiment shown in FIG. 1. Different, however, the switched-capacitor converter 400 shown in FIG. 4 also includes a current limited source 402 coupled between the input Vin and the legs of the switched-capacitor converter 400. The current limited source 402 is a circuit having an element that limits the maximum (inrush) current during startup, while at least one of the capacitors is pre-charging. Any circuit that has an upper limit on the current which depends on the voltage across the circuit can be used as the current limited source 402, such as, but not limited to a resistor, a MOSFET in saturation, a BJT in linear mode operation, etc.

In one embodiment, the current limited source 402 pre-charges at least the capacitor C1 closest to the input Vin during startup and stops charging capacitor C1 when the voltage across capacitor C1 reaches a predetermined level. Any of the capacitor pre-charging embodiments described above in connection with FIGS. 1 through 3 can be implemented in conjunction with the current limited source embodiment of FIG. 4, and are not repeated here. Described next are other embodiments of the current limited source 402.

Figure 6:
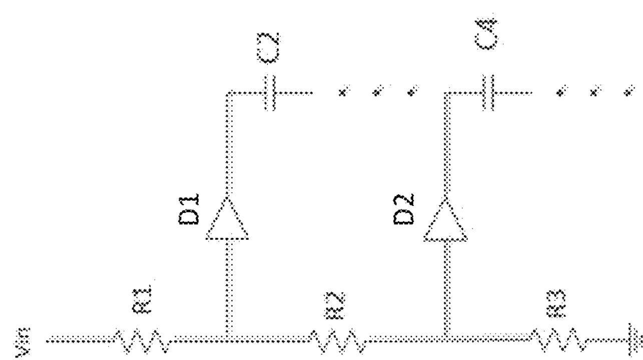
FIGS. 5 through 9 illustrates respective circuit schematics of current limited sources for implementing capacitor pre-charging during startup.
Figure 5:
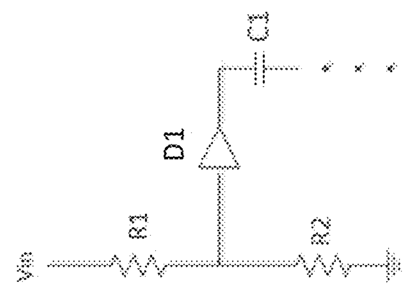

FIGS. 5 and 6 illustrate the current limited source 402 implemented as a resistor divider R1/R2 (FIG. 5) or R1/R2/R3 (FIG. 6) and a diode D1 (FIG. 5) or D1/D2 (FIG. 6) connecting the input Vin to the capacitor C1 closest to the input. The resistor divider/diode arrangement can pre-charge resonant capacitor C1 by itself as shown in FIG. 5, or flying capacitors C2 and C4 at different voltages as shown in FIG. 6.

Figure 8:
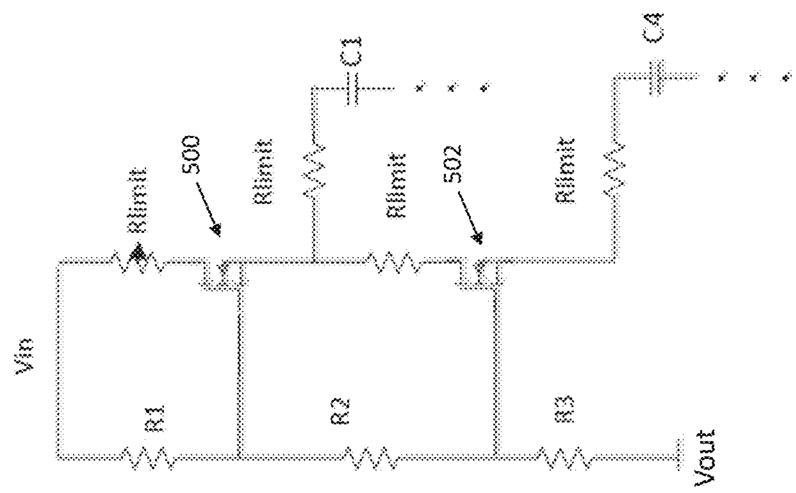
Figure 7:
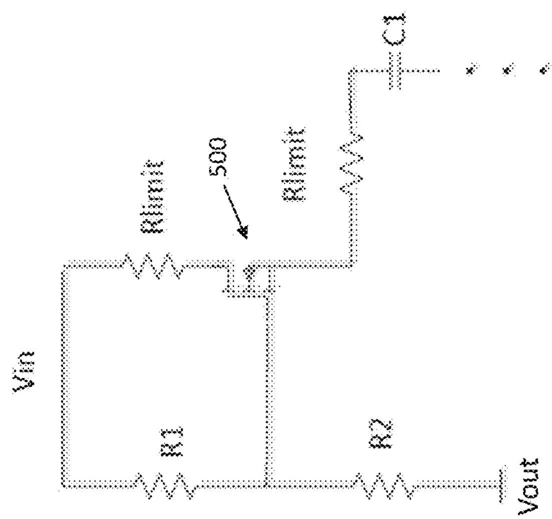

FIGS. 7 and 8 illustrate additional resistor divider/diode implementations of the current limited source 402, wherein the resistor divider goes into Vout directly instead of ground (at the risk of direct connection from Vin to Vout). Also, a buffer FET or NPN bipolar transistor 500/502 can be used with a current limiting resistor Rlimit to reduce the power loss in the resistor divider while limiting the inrush current during startup. Each current limiting resistor Rlimit can be in series with the source/emitter or drain/collector of the corresponding buffer FET/NPN bipolar transistor 500/502.

Figure 9:
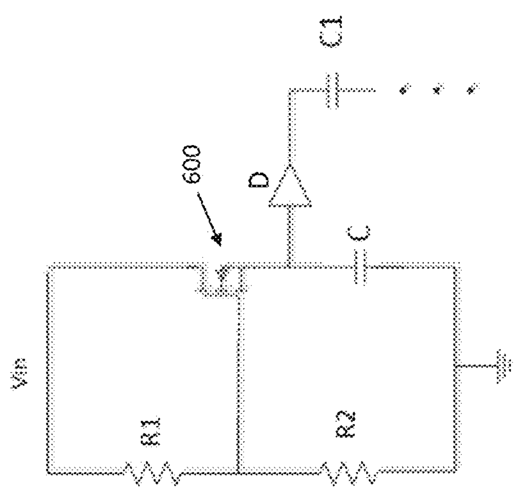

FIG. 9 illustrates the current limited source 402 implemented as a charge pump that pre-charges one or more of the capacitors to a certain level. The charge pump is connected to at least the capacitor C1 closest to the input, and includes e.g. a resistor divider R1/R2, transistor 600, diode D, and capacitor C. The charge pump can be autonomous in that the charge pump can be disabled responsive to the voltage reaching a certain level, or the controller 110 can disable the charge pump.

The current limited source 402 can provide a single tap between the input Vin and the capacitor C1 closest to the input. In this configuration, the pre-charging sequence includes the controller 110 turning on switch devices Q8 and Q10 to prevent overcharging of the output Vout, which is not likely to happen since preferably Cout>>C1. The controller 110 turns on switch device Q2 through Q5 to charge capacitors C2 through C5, and then successively turns off switch devices Q5 through Q2 to limit the voltage on capacitors C5 through C2. The time constant is set mostly by flying capacitors C2 and C4, so the initial voltage on resonant capacitor C1 should not matter and the controller 110 can set the on-time for switch device Q1 to ensure proper pre-charging. Once the capacitors have been pre-charged, the controller 110 can exit startup and enter normal (post startup) operation.

In another embodiment, the current limited source 402 has dual taps between the input Vin and the capacitor C1 closest to the input. In this configuration, the pre-charging sequence includes the controller 110 turning on switch devices Q8 and Q10 to prevent overcharging of the output Vout. Resonant capacitors C1 and C3 are pre-charged through body diodes of switch devices Q2 and Q4, to values slightly below the voltages across flying capacitors C2 and C4, respectively. The controller 110 turns off switch device Q10, and then turns on switch devices Q2 and Q4 to pre-charge resonant C1 and C3 to about the same level as flying capacitors C2 and C4, respectively. This pre-charging is damped by the current limited source 402, so the timing need not be precisely determined. If needed, the controller 110 can pulse switch devices Q2 and Q4 to limit the currents which pre-charge flying capacitors C2 and C4, respectively.

Figure 10:
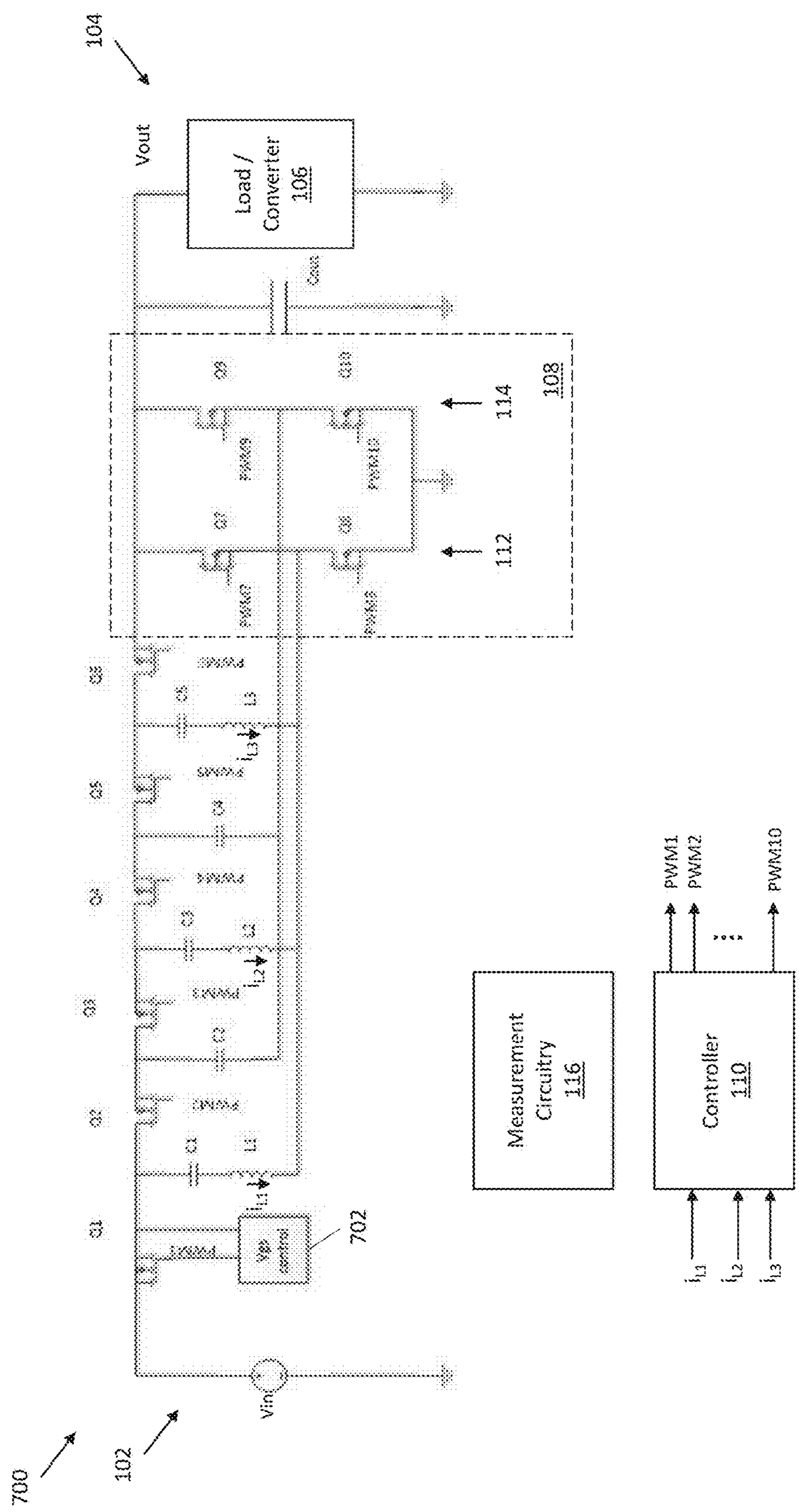
FIG. 10 illustrates a block diagram of another embodiment of a switched-capacitor converter with capacitor pre-charging.

FIG. 10 illustrates still another embodiment of a switched-capacitor converter 700 with capacitor pre-charging during startup. The switched-capacitor converter embodiment shown in FIG. 10 is similar to the embodiment shown in FIG. 1. Different, however, the controller 110 of the switched-capacitor converter 700 shown in FIG. 10 includes circuitry 702 for adjusting the gate-to-source voltage (Vgs) applied to at least the switch device Q1 closest to the input Vin, to adjust the on-state resistance ($R_{DSon}$) of the at least one switch device Q1 during startup. This approach is similar to the shunt resistor approach described in connection with FIG. 3, however there is no need for an external shunt circuit. Instead, the shunt value is a gate resistance value controlled by the on-state resistance ($R_{DSon}$) of at least the switch device Q1 closest to the input Vin. For this purpose, the gate-to-source voltage Vgs of switch device Q1 can be reduced to increase on-state resistance during startup.

Figure 11:
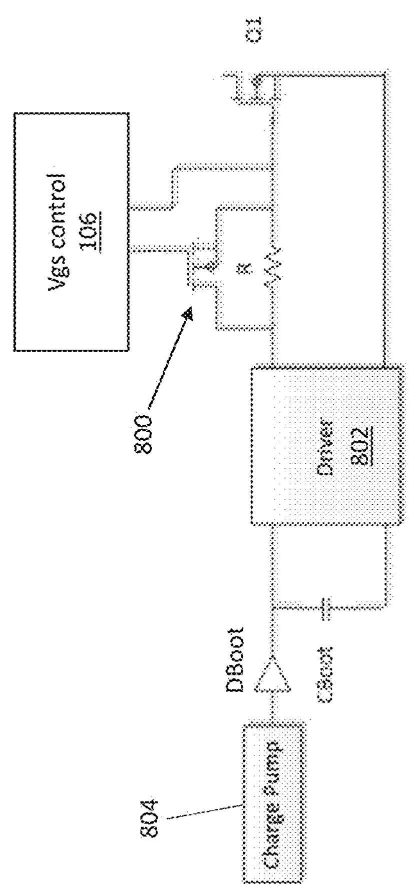
FIGS. 11 and 12 illustrates respective block diagrams of circuitry for adjusting the on-state resistance of at least one switch device included in a switched-capacitor converter, for implementing capacitor pre-charging during startup.

FIG. 11 illustrates one embodiment of the gate-to-source voltage Vgs control technique, for adjusting the on-state resistance $R_{DSon}$ of at least the switch device Q1 closest to the input Vin. According to this embodiment, one or more n-channel MOSFETs 800 and a gate shunt resistor R are provided between the gate driver 802 for switch device Q1 and the gate input of switch device Q1. Other auxiliary devices, such as p-Channel MOSFETs for example, can be used instead. A charge pump 804 and related diode and capacitor circuitry DBoot/CBoot power the gate driver 802 during startup. The gate-to-source voltage Vgs of switch device Q1 is controlled based on the desired amount of (gate) shunt resistance. The gate-to-source voltage Vgs can be controlled by adding more or less resistance at the gate of switch device Q1. During normal (post startup) operation, the bypass switch 800 is on and a lower Vgs is applied to switch device Q1.

Figure 12:
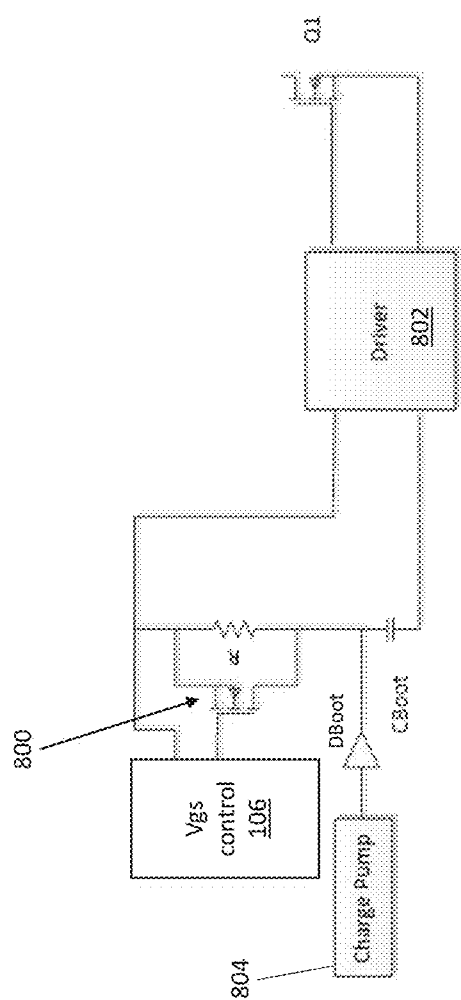

FIG. 12 illustrates another embodiment of the gate-to-source voltage Vgs control technique, for adjusting the on-state resistance $R_{DSon}$ of at least the switch device Q1 closest to the input Vin. The embodiment shown in FIG. 12 is similar to the embodiment shown in FIG. 11. Different, however, the gate shunt resistor R and corresponding switch device 800 is placed before the gate driver 802 for switch device Q1, so that the gate driver 802 is between switch device Q1 and the gate shunt resistor R.

Figure 13:
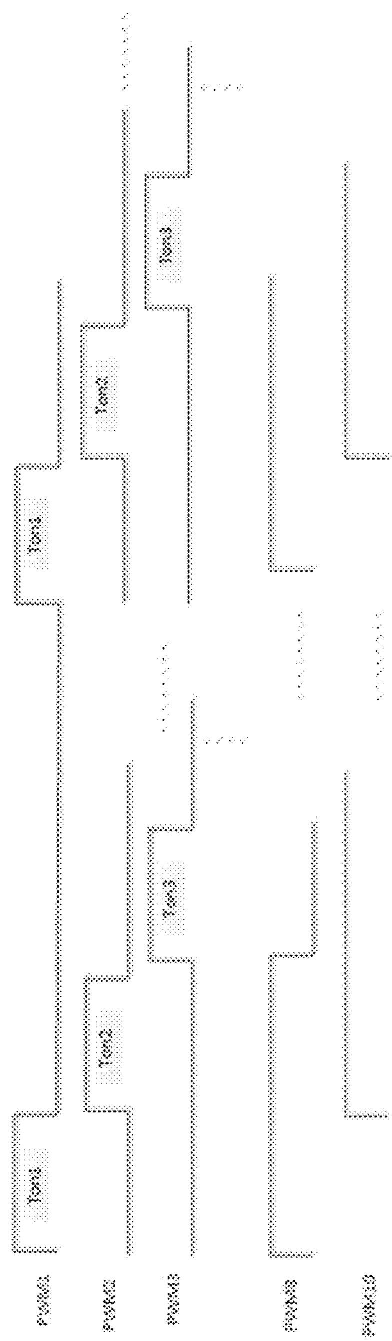
FIG. 13 illustrates PWM signals for implementing capacitor pre-charging in a switched-capacitor converter.

FIG. 13 illustrates another embodiment of the capacitor pre-charging process implemented by the switched-capacitor converter controller 110. According to this embodiment, the controller 110 turns each switch device on and off in succession in a burst mode during startup. The controller 110 starts with the switch device Q1 closest to the input Vin and ends with the switch device Q6 furthest from the input Vin. The on-time of each switch device is labelled 'Tonx' in FIG. 13. With this approach, inductor L1 and resonant capacitor C1 are energized through switch device Q1 for a certain period (Ton1) and then the energy is transferred downstream to the rest of the legs. The controller 110 can repeat the burst mode at least one time during startup, to ensure all leg capacitors are pre-charged to the desired respective levels.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A switched-capacitor converter, comprising:

an input;

an output;

a rectifier at the output;

a plurality of legs coupled between the input and the rectifier, each leg comprising a capacitor, a first group of the legs being coupled to a first branch of the rectifier and a second group of the legs being coupled to a second branch of the rectifier;

measurement circuitry configured to sense or estimate the voltage across each of the capacitors during startup;

a switch device connected to each leg; and a controller operable to alternate switching of the first and the second groups of legs after startup, to transfer energy from the input to the output during a first part of each switching cycle via the first group of legs and to transfer energy to the output during a second part of each switching cycle via the second group of legs, and to control the switch devices during startup so that a combination of the switch devices which are normally switched in a complementary manner after startup are on at the same time to pre-charge at least one of the capacitors from an initial capacitor voltage of either zero or a value different from a steady-state voltage of the at least one capacitor, and to turn off each switch device during startup when the voltage sensed across the capacitor connected to the switch device reaches a predetermined level, so that the switch devices connected to the capacitors with lower predetermined levels are turned off before the switch devices connected to the capacitors with higher predetermined levels during startup.

2. The switched-capacitor converter of claim 1, further comprising a shunt resistor between the input and the plurality of legs, wherein the controller is operable to bypass the shunt resistor after startup.

3. The switched-capacitor converter of claim 1, wherein the controller is operable to turn on one or more switch devices of the rectifier during startup to prevent overcharging of the output.

4. The switched-capacitor converter of claim 1, wherein the controller is operable to successively turn on the switch devices during startup, beginning with the switch device closest to the input and ending with the switch device furthest from the input.

5. A switched-capacitor converter, comprising:

an input;

an output;

a rectifier at the output;

a plurality of legs coupled between the input and the rectifier, each leg comprising a capacitor, a first group of the legs being coupled to a first branch of the rectifier and a second group of the legs being coupled to a second branch of the rectifier;

a switch device connected to each leg;

a controller operable to alternate switching of the first and the second groups of legs after startup, to transfer energy from the input to the output during a first part of each switching cycle via the first group of legs and to transfer energy to the output during a second part of each switching cycle via the second group of legs; and a current limited source coupled between the input and the plurality of legs and operable to pre-charge, during startup, at least one of the capacitors from an initial capacitor voltage of either zero or a value different from a steady-state voltage of the at least one capacitor, wherein the controller is further operable to disable the current limited source after each capacitor being pre-charged during startup reaches a predetermined voltage level for the capacitor.

6. The switched-capacitor converter of claim 5, wherein the current limited source is operable to pre-charge the capacitor closest to the input during startup and stop charging that capacitor when the voltage across the capacitor reaches a predetermined level.

7. The switched-capacitor converter of claim 5, wherein the current limited source comprises a resistor divider and a diode connecting the input to the capacitor closest to the input.

8. The switched-capacitor converter of claim 5, wherein the current limited source comprises a charge pump connected to the capacitor closest to the input.

9. The switched-capacitor converter of claim 5, wherein the current limited source provides a single tap between the input and the capacitor closest to the input.

10. The switched-capacitor converter of claim 5, wherein the current limited source provides dual taps between the input and the capacitor closest to the input.

11. The switched-capacitor converter of claim 5, wherein the controller is operable to control the switch devices during startup so that a combination of the switch devices which are normally switched in a complementary manner after startup are on at the same time to aid in pre-charging at least one of the capacitors.

12. The switched-capacitor converter of claim 5, wherein the controller is operable to turn on one or more switch devices of the rectifier during startup to prevent overcharging the output.

13. The switched-capacitor converter of claim 5, wherein the controller is operable to successively turn on the switch devices during startup, starting with the switch device closest to the input and ending with the switch device furthest from the input.

14. A switched-capacitor converter, comprising:

an input;

an output;

a rectifier at the output;

a plurality of legs coupled between the input and the rectifier, each leg comprising a capacitor, a first group of the legs being coupled to a first branch of the rectifier and a second group of the legs being coupled to a second branch of the rectifier;

a switch device connected to each leg;

a shunt resistor connected to a gate of at least one of the switch devices; and a controller operable to alternate switching of the first and the second groups of legs after startup, to transfer energy from the input to the output during a first part of each switching cycle via the first group of legs and to transfer energy to the output during a second part of each switching cycle via the second group of legs, wherein the controller is operable to adjust a gate-to-source voltage applied to the at least one switch device during a startup interval in which at least one of the capacitors is pre-charged from an initial capacitor voltage of either zero or a value different from a steady-state voltage of the capacitor, to adjust an on-state resistance of the at least one switch device, and is further operable to bypass the shunt resistor after the startup interval.

15. A switched-capacitor converter, comprising:

an input;

an output;

a rectifier at the output;

a plurality of legs coupled between the input and the rectifier, each leg comprising a capacitor, a first group of the legs being coupled to a first branch of the rectifier and a second group of the legs being coupled to a second branch of the rectifier;

a switch device connected to each leg; and a controller operable to:

alternate switching of the first and the second groups of legs after startup, to transfer energy from the input to the output during a first part of each switching cycle via the first group of legs and to transfer energy to the output during a second part of each switching cycle via the second group of legs, and control the switch devices during startup so that a combination of the switch devices that are normally switched in a complementary manner after startup are on at the same time to pre-charge at least one of the capacitors from an initial capacitor voltage of either zero or a value different from a steady-state voltage of the at least one capacitor, and to turn off each switch device during startup when a timer value assigned to the switch device expires, wherein the timer values correspond to respective pre-charge voltages of the capacitors connected to the switch devices, and wherein at least some of the pre-charge voltages differ from each other.

* * * * *